United States Patent
Prasad et al.

(10) Patent No.: US 9,712,144 B2
(45) Date of Patent: Jul. 18, 2017

(54) FINE DELAY STRUCTURE WITH PROGRAMMABLE DELAY RANGES

(71) Applicant: International Business Machines Corporation, Armonk, NY (US)

(72) Inventors: Mangal Prasad, Poughkeepsie, NY (US); Marshall D. Tiner, Elgin, TX (US); Hung H. Tran, Chicago, IL (US); Xiaobin Yuan, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/844,197

(22) Filed: Sep. 3, 2015

(65) Prior Publication Data

US 2016/0373100 A1   Dec. 22, 2016

Related U.S. Application Data (63) Continuation of application No. 14/742,783, filed on Jun. 18, 2015.

(51) Int. Cl.
*H03K 5/14* (2014.01)

(52) U.S. Cl.
CPC .................................... *H03K 5/14* (2013.01)

(58) Field of Classification Search
CPC ...................................................... H03K 5/14
See application file for complete search history.

(56) References Cited

U.S. PATENT DOCUMENTS

| | | | | |
|---|---|---|---|---|
| 6,259,330 B1* | 7/2001 | Arai | ...................... | H03K 3/011 331/177 R |
| 6,630,860 B1* | 10/2003 | Anumula | ................ | H03L 7/093 327/308 |
| 8,058,919 B2* | 11/2011 | Takahashi | ................ | H03H 7/30 327/261 |
| 9,000,822 B2 | 4/2015 | Drake et al. | | |
| 9,407,247 B2 | 8/2016 | Drake et al. | | |
| 2016/0373099 A1 | 12/2016 | Prasad et al. | | |

FOREIGN PATENT DOCUMENTS

EP             1096666 A2      5/2001

OTHER PUBLICATIONS

Alan J. Drake, et al.; "Programmable Delay Circuit"; U.S. Appl. No. 13/859,544, filed Apr. 9, 2013.
Alan J. Drake, et al.; "Programmable Delay Circuit"; U.S. Appl. No. 14/520,743, filed Oct. 22, 2014.
(Continued)

*Primary Examiner* — Hai L Nguyen
(74) *Attorney, Agent, or Firm* — Cantor Colburn LLP (57) ABSTRACT

A circuit includes a first node, a first inverter connected to the first node and a second node. A variable resistive element is connected to the second node and a third node. A first switch is connected to the second node, a first capacitive element is connected in series with the first switch and the third node, a second switch connected to the second node, a second capacitive element is connected in series with the second switch and the third node, and a second inverter is connected to the third node and a fourth node.

7 Claims, 6 Drawing Sheets

(56) References Cited

OTHER PUBLICATIONS

List of IBM Patents or Patent Applications Treated as Related—Date Filed: Oct. 13, 2015; 1 page.
Mangal Prasad, et al.; "Fine Delay Structure With Programmable Delay Ranges"; U.S. Appl. No. 14/742,783, filed Jun. 18, 2015.
Beukema, et al., "A 6.4-Gb/s CMOS SerDes Core With Feed-Forward and Decision-Feedback Equalization", IEEE Journal of Solid-State Circuits, pp. 2633-2645, vol. 40, No. 12, Dec. 2005, IEEE.
Maneatis, et al., "Precise Delay Generation Using Coupled Oscillators", IEEE Journal of Solid-State Circuits, vol. 28, No. 12, pp. 1273-1282; Dec. 1993, IEEE.
Tsai, et al., "An All-Digital High-Precision Built-In Delay Time Measurement Circuit", 26th IEEE VLSI Test Symposium, pp. 249-254; May 2008, IEEE Computer Society.
List of IBM Patents or Patent Applications Treated as Related, U.S. Appl. No. 14/844,197, filed Sep. 3, 2015, 2 Pages.
Mangal Prasad, et al.; "Fine Delay Structure With Programmable Delay Ranges"; U.S. Appl. No. 15/456,985, filed Mar. 13, 2017.

\* cited by examiner

FINE DELAY STRUCTURE WITH PROGRAMMABLE DELAY RANGES

PRIORITY

This application is a continuation of and claims priority from U.S. patent application Ser. No. 14/742,783, filed on Jun. 18, 2015, entitled "FINE DELAY STRUCTURE WITH PROGRAMMABLE DELAY RANGES", the entire contents of which are incorporated herein by reference.

BACKGROUND

The present invention relates to delay circuits, and more specifically, to programmable delay circuits.

Delay circuits are used in a variety of devices to control signal phases, clocks, and other signals. Delay circuits may be analog or digital controlled and are used in clock skew or recover circuits and fine delay adjustments for calibrating signals.

SUMMARY

According to one embodiment of the present invention, a circuit includes a first node, a first inverter connected to the first node and a second node, a variable resistive element connected to the second node and a third node. The embodiment also includes a first switch connected to the second node, a first capacitive element connected in series with the first switch and the third node, a second switch connected to the second node, a second capacitive element connected in series with the second switch and the third node, and a second inverter connected to the third node and a fourth node.

According to another embodiment of the present invention, a system includes a coarse signal delay portion operative to receive a signal and output a coarse delay signal and a fine signal delay portion comprising a first node connected to an output node of the coarse signal delay portion, a first inverter connected to the first node and a second node. The embodiment also includes a resistive element connected to the second node and a third node, a first switch connected to the second node, a first capacitive element connected in series with the first switch and the third node, a second switch connected to the second node, a second capacitive element connected in series with the second switch and the third node, and a second inverter connected to the third node and a fourth node.

According to yet another embodiment of the present invention, a method for controlling a fine delay circuit includes controlling a state of a first switch connected to a first capacitive device, controlling a state of a second switch connected to a second capacitive device. The state of the first switch and the state of the second switch controls a total capacitance of the fine delay circuit, and controlling a variable resistive device arranged in parallel with the first capacitive device and a second capacitive device to control a delay of a signal input to the fine delay circuit.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Uniformly stepped fine delay and phase control circuits are widely used in high speed digital designs. Delay circuits are used for clock skew and recovery circuits and fine delay adjustments in other circuits. Delay circuits may be analog or digital. Analog delay circuits often exhibit good resolution and sensitivity to power voltage and temperature, but offer poor linearity and uniformity. Digital phase blending circuits offer good resolution, but the linearity and uniformity of digital delay circuits is often within a small process window. Digital delay circuits offer poor power, voltage, and temperature sensitivity.

Figure 1:
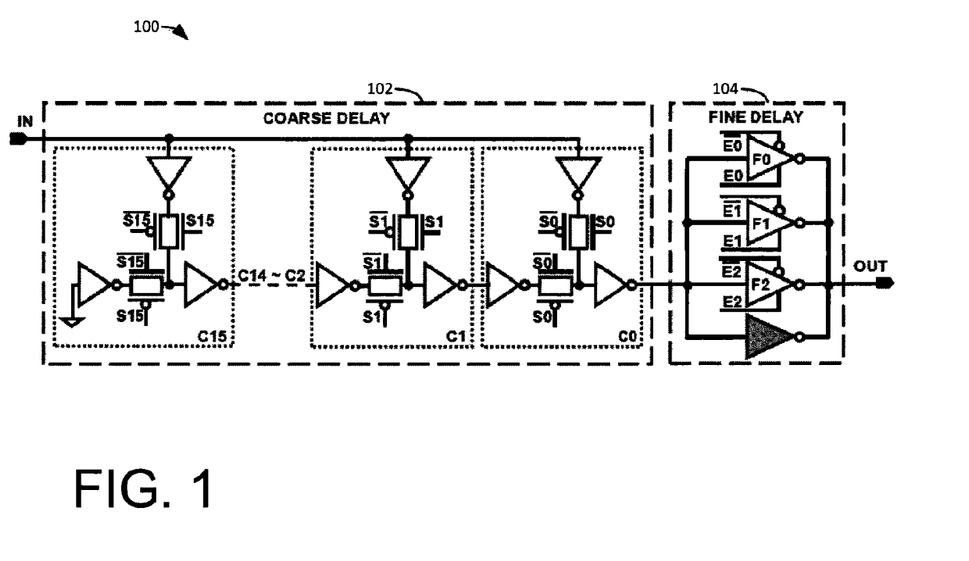
FIG. 1 illustrates an example of a delay circuit.

FIG. 1 illustrates an example of a delay circuit 100 used in signal calibration. The circuit 100 includes a coarse delay portion 102 and a fine delay portion 104. In the illustrated example, one coarse delay equals four fine delays. The active inverter elements of the fine delay portion 104 F0, F1, and F2 exhibit a local variability under simulation at a low supply voltage. The tracking of the coarse and fine delays also exhibits undesirable variability in the coarse-fine transition step.

It is desirable for a fine delay circuit to exhibit low local variability and to have a programmable delay range to reduce undesirable variability in the coarse-fine transition step.

Figure 2:
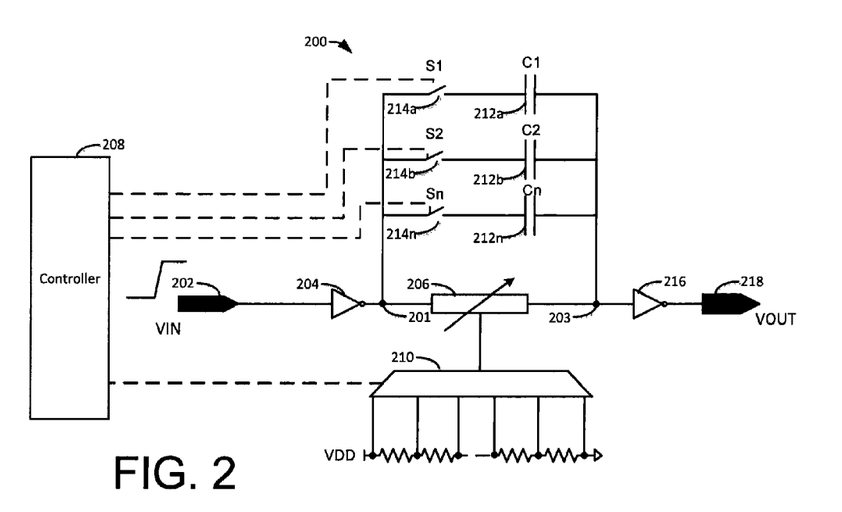
FIG. 2 illustrates an exemplary embodiment of a fine delay circuit.

FIG. 2 illustrates an exemplary embodiment of a fine delay circuit 200 that may be used with a coarse delay circuit (not shown). The fine delay circuit 200 exhibits a low delay mismatch due to the use of passive elements and provides a programmable range to improve integration with a coarse delay circuit.

The circuit 200 includes an input terminal 202 that receives the signal voltage in (VIN). The signal passes through a first inverter 204 that has an output connected to an input of a variable resistive element 206 at a node 201. The variable resistive element 206 may include for, example, an active element such as a field effect transistor (FET) such as an nFET that is controlled by a positive supply voltage (VDD) applied to the gate terminal of the FET. The VDD applied to the FET may be controlled by a controller 208 that controls a switching device 210 that may include, for example, a multiplexing (MUX) device. The switching device 210 in the illustrated embodiment is connected to the VDD signal that passes through resistive elements that reduce the voltage of the VDD signal across nodes connected to the switching device 210. The illustrated embodiment include but one example of a method for controlling the voltage VDD that is applied to the variable resistive element 206. Other suitable voltage control methods may be used.

The circuit 200 includes an array of capacitive elements 212a-n, which may include for example, a fin type capacitor (fincap). The capacitive elements 212a-n are each connected to the node 201 via a switching element 214a-n. The switching elements 214a-n may be controlled by the controller 208. The switching elements 214a-n may include, for example, a FET type switching device. The number of capacitive elements 212 and capacitance of the individual capacitive elements 212 may be equal, or may be different depending on the application of the delay circuit 200. The capacitive elements 212a-n and the output of the variable resistive element 206 are connected to the node 203. The signal passes through a second inverter 216 that is connected to the node 203 and an output terminal 218.

In operation, the controller 208 may tune the delay circuit 200 by controlling the states of each the switching elements 214a-n to open or closed to increase or decrease the total capacitance exhibited by the array of capacitive elements 212a-n. The states of the switching elements 214n generate the delay steps in the delay circuit 200. The variable resistance of the resistive element provides a programmable range for the delay circuit 200 and improves the flexibility of the delay circuit 200 when the delay circuit 200 is connected to an output of a coarse delay circuit.

Figure 3:
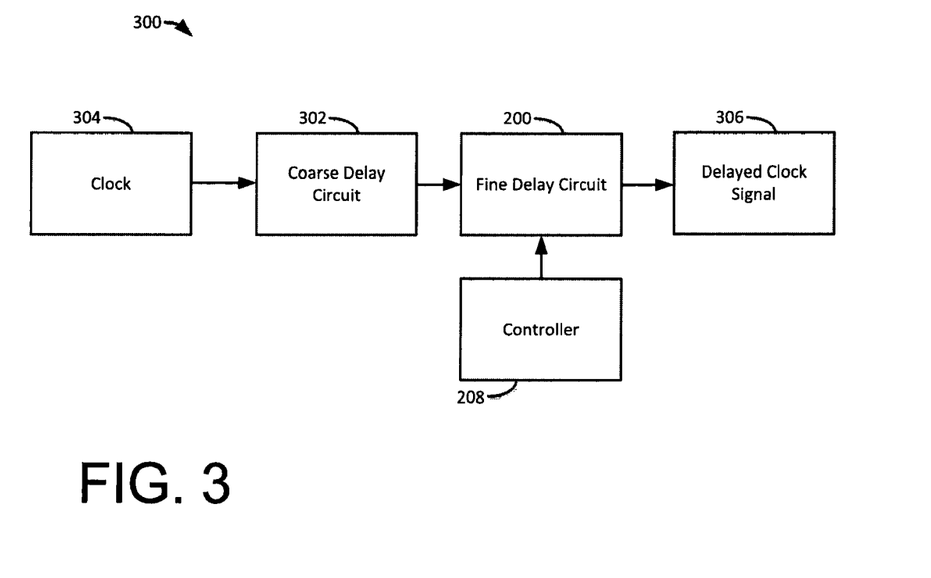
FIG. 3 illustrates an exemplary embodiment of a system.

FIG. 3 illustrates an exemplary embodiment of a system 300 that includes the fine delay circuit 200. The system 300 includes a clock 304 that outputs a clock signal to a coarse delay circuit 302. The coarse delay circuit delays the clock signal and outputs a coarse delayed clock signal to the fine delay circuit 200 that is controlled by the controller 208. The fine delay circuit 200 outputs a delayed clock signal 306. The delayed clock signal 306 may be used in a variety of devices such as, for example, processors or communications devices.

Figure 4:
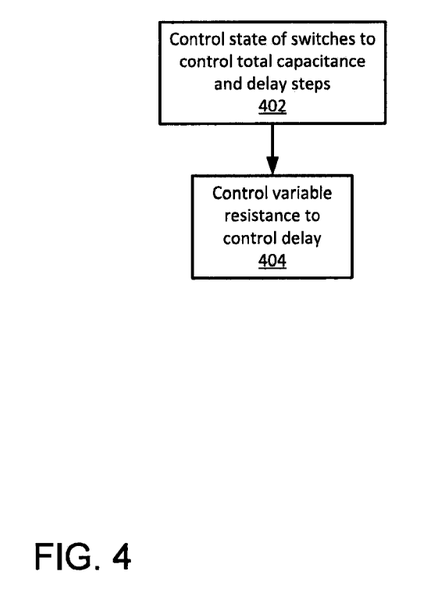
FIG. 4 illustrates a block diagram of an exemplary method for controlling the fine delay circuit.

FIG. 4 illustrates a block diagram of an exemplary method for controlling the fine delay circuit 200. In block 402 the state of the switching elements 214 (of FIG. 2) are controlled to set a total capacitance of the fine delay circuit 200. In block 404 the variable resistance of the variable resistive element 206 is controlled to set the delay of the fine delay circuit 200.

Figure 5:
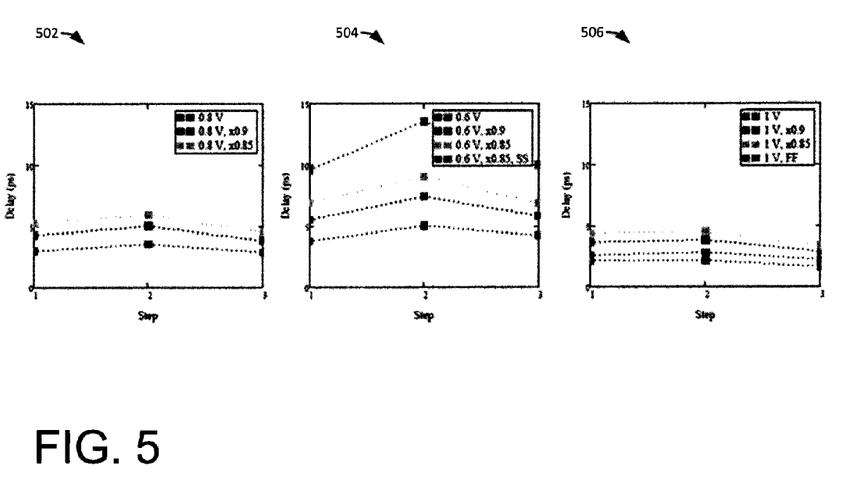
FIG. 5 illustrates graphs that show the delay of the fine delay circuit of FIG. 2 across a range of VDD voltages.

FIG. 5 illustrates graphs 502, 504, and 505 that show an example of the delay of the fine delay circuit 200 (of FIG. 2) across a range of VDD voltages. Graph 502 shows delay steps at 0.8 V supply voltage. The X0.9 and X0.85 in the legend indicate that the gate control voltage that is applied on the variable resistance element 206 (realized by a FET) are scaled down by 0.9 and 0.85. The graphs 504 and 506 show delay steps at 0.6 and 1 V supply voltages respectfully. SS and FF denote slow and fast process corners.

Figure 6:
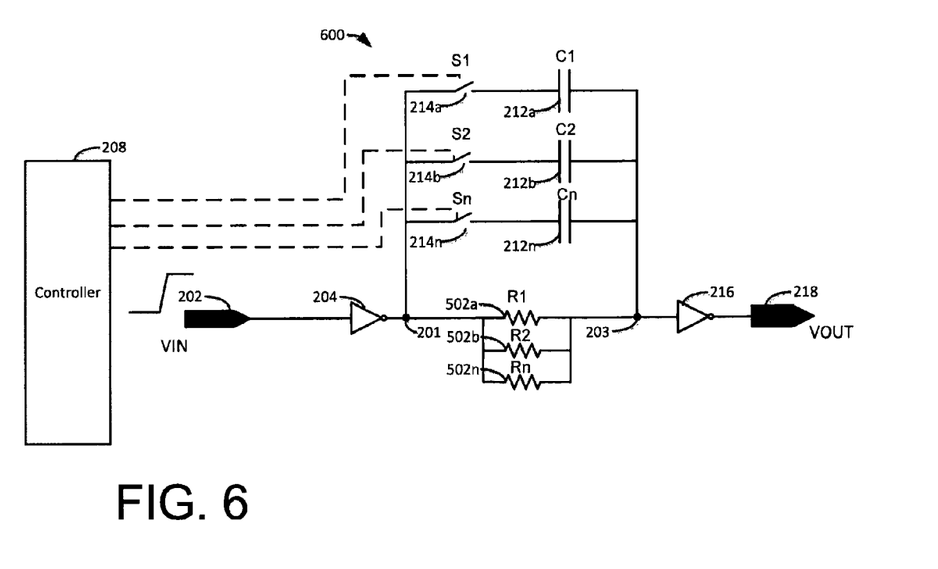
FIG. 6 illustrates an alternate exemplary embodiment of a fine delay circuit.

FIG. 6 illustrates an alternate exemplary embodiment of a fine delay circuit 500. The circuit 500 is similar in operation to the circuit 200 (of FIG. 2) described above. The circuit 500 includes resistors R1-Rn 502a-n arranged in parallel and connected to the nodes 201 and 203. The resistors 502 may include any number of resistors having similar or different resistivity. Changing the arrangement of the resistors 502 allows a user to vary the resistance or change the resistance in the circuit 500.

The embodiments described herein include a fine delay circuit that has uniform steps with low local variability and an improved transition step between a coarse delay circuit and the fine delay circuit portion. The fine delay circuit offers improved sensitivity to environmental factors including power, voltage, and temperature.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
a coarse signal delay portion operative to receive a signal and output a coarse delay signal; and
a fine signal delay portion comprising:
 a first node connected to an output node of the coarse signal delay portion;
 a first inverter connected to the first node and a second node;
 a variable resistive element connected to the second node and a third node, wherein the variable resistive element includes a field effect transistor device;
 a first switch connected to the second node;
 a first capacitive element connected in series with the first switch and the third node and arranged in parallel and connected with the first node and the second node;
 a second switch connected to the second node;
 a second capacitive element connected in series with the second switch and the third node and arranged in parallel and connected with the first node and the second node; and
 a second inverter connected to the third node and a fourth node.

2. The system of claim 1, further comprising a controller connected to the first switch and the second switch, the controller operative to control a state of the first switch and a state of the second switch.

3. The system of claim 2, wherein the controller is operative to control the state of the first switch and the state of the second switch independently.

4. The system of claim 2, wherein the state of the first switch is operative to change a total capacitance of the circuit.

5. The system of claim 1, wherein the switching device is operative to control a voltage applied to the variable resistive element.

6. The system of claim 1, wherein a capacitance of the first capacitive element is dissimilar from a capacitance of the second capacitive element.

7. The system of claim 1, wherein a capacitance of the first capacitive element is equal to a capacitance of the second capacitive element.

* * * * *